US006822597B2

(12) United States Patent
Draxelmayr et al.

(10) Patent No.: US 6,822,597 B2
(45) Date of Patent: Nov. 23, 2004

(54) COMPARATOR CIRCUIT FOR MAPPING AN ANALOG INPUT SIGNAL INTO A DIGITAL OUTPUT SIGNAL

(75) Inventors: Dieter Draxelmayr, Villach (AT); Bernhard Forster, Finkenstein (AT); Mario Motz, Wernberg (AT); Tobias Werth, Villach (AT)

(73) Assignee: Infineon Technologies AG, München (DE)

( * ) Notice: Subject to any disclaimer, the term of this patent is extended or adjusted under 35 U.S.C. 154(b) by 0 days.

(21) Appl. No.: 10/445,607

(22) Filed: May 27, 2003

(65) Prior Publication Data

US 2003/0231129 A1 Dec. 18, 2003

(30) Foreign Application Priority Data

May 27, 2002 (DE) .......................................... 102 23 514

(51) Int. Cl.[7] ................................................. H03M 1/12
(52) U.S. Cl. ........................................ 341/155; 341/120
(58) Field of Search ................................. 341/155, 158, 341/118, 120; 327/63, 71, 74

(56) References Cited

U.S. PATENT DOCUMENTS

| | | | |
|---|---|---|---|
| 4,418,332 A | | 11/1983 | Mefford ...................... 327/69 |
| 4,584,566 A | * | 4/1986 | Arcara ........................ 341/128 |
| 5,103,171 A | | 4/1992 | Petersen ...................... 324/161 |
| 5,418,409 A | * | 5/1995 | Kuhn ............................ 327/78 |
| 6,407,603 B2 | * | 6/2002 | Bendall ....................... 327/175 |

FOREIGN PATENT DOCUMENTS

| | | | | |
|---|---|---|---|---|
| DE | 39 26 617 | | 2/1991 | ............. G01P/3/42 |
| DE | 197 10 576 | | 9/1998 | ............. H03K/5/08 |
| DE | 100 42 270 | | 3/2002 | ............. H03K/5/08 |

OTHER PUBLICATIONS

Tietze/Schenk, *Halbleiter–Schaltungstechnik*, 9th Edition, Berlin: Springer, 1990, p. 185.

* cited by examiner

*Primary Examiner*—Peguy JeanPierre
(74) *Attorney, Agent, or Firm*—Schiff Hardin LLP

(57) ABSTRACT

The invention is direct to a comparator circuit that maps an analog input signal into a digital output signal and comprises a threshold as well as an upper and a lower hysteresis threshold. Given transgression of the upper or lower hysteresis threshold by the analog input signal, at least one unlatch signal is formed that enables the switching of the digital output signal when the analog input signal upwardly transgresses the threshold. Independently of at least one unlatch signal, the digital output signal is inventively switched when the analog input signal transgresses the upper or lower hysteresis threshold.

13 Claims, 3 Drawing Sheets

COMPARATOR CIRCUIT FOR MAPPING AN ANALOG INPUT SIGNAL INTO A DIGITAL OUTPUT SIGNAL

BACKGROUND OF THE INVENTION

1. Field of the Invention

The invention is directed to a comparator circuit that maps an analog input signal into a digital output signal.

2. Description of the Related Art

A comparator circuit maps an analog input voltage into a digital output signal. To this end, an analog input voltage is compared to a threshold. The value of the digital output signal depends on whether the analog input voltage upwardly or downwardly transgresses the threshold.

In practice (e.g., when using a comparator circuit in a sensor circuit), the analog input voltage has unwanted signals and noise parts. As a rule, these unwanted signal parts can cause the digital output signal to switch, which then, however, no longer corresponds to the actual analog input signal. It is especially high-frequency noise parts in the analog input voltage that cause a frequent switching back and forth in the comparator circuit and cause an erroneous digital output signal. Another problem is thermal drifting, particularly of the comparator circuit, resulting in a precision loss of the mapping of the analog input voltage onto the digital output signal.

In order to avoid these problems, it is known to provide a comparator circuit with a hysteresis (a Schmitt trigger). A precision Schmitt trigger is described, for example, in Tietze/Schenk, *Halbleiter-Schaltunastechnik*, 9$^{th}$ Edition, Berlin: Springer, page 185. Two comparators whose digital output signals are employed for setting and resetting a flip-flop are employed in this comparator circuit with two thresholds. As a result, the thresholds or switchover levels of the comparator circuit can be set especially precisely.

What is disadvantageous about comparators circuits with hysteresis, however, is the technically caused divergence of the cut-in and cut-out point. The cut-in and cut-out point is the switching of the comparator circuit given upward transgression of a first threshold (first hysteresis threshold) in a first change direction of the analog input signal or upward transgression of a second threshold (second hysteresis threshold) in a second change direction of the analog input signal. In order to be able to filter out unwanted signals in the analog input signal, the cut-in and cut-out points of the hysteresis should lie so far apart that unwanted signals can no longer cause a switching of the comparator circuit. In other words, the size of the hysteresis determines the degree of the noise suppression but also determines the deviation from the desired threshold.

An improvement of the precision Schmitt trigger is disclosed, for example, by U.S. Pat. No. 4,418,332. The Schmitt trigger disclosed therein is a comparator circuit with a hidden hysteresis. This is achieved by using a first comparator without hysteresis and a second comparator with hysteresis. The second comparator generates an unlatch signal for the first comparator. As a result, deviations of the switching points or switchover levels of the comparator circuit from the desired threshold of the comparator circuit are largely avoided since the cut-in point coincides with the cut-out point in the first comparator without hysteresis. By using a blocking or latching, the second comparator prevents a switchover of the digital output signal due to unwanted signals in the analog input signal. Although the hysteresis-conditioned deviation from the desired threshold is largely avoided by this comparator circuit with hidden hysteresis, this design also exhibits a false switching behavior, namely, when an analog input signal is present that just reaches the wanted threshold or switching threshold but does not reach the hysteresis threshold of the second comparator. Moreover, a "false" digital output signal is retained even given subsequent, great differences between analog input signal and desired switching threshold. Although the probability of this can be reduced by using hysteresis that are selected very small, this condition cannot be completely avoided. Moreover, the malfunction susceptibility via a vis unwanted signals is increased given very small hysteresis.

SUMMARY OF THE INVENTION

It is therefore an object of the present invention to provide a comparator circuit that essentially avoids the initially cited problems. This object is achieved by a comparator circuit having the features described below.

The invention comprises a compulsory switching of a digital output signal given upward transgression of an upper hysteresis threshold or given downward transgression of a lower hysteresis threshold by an analog input signal. As a result, the advantages of a hysteresis in view of unwanted signals in the analog input signal are combined such that, with the precision of a comparator without hysteresis, a comparator circuit is created that precisely maps the analog input signal into a digital output signal.

The invention is directed to a comparator circuit that maps an analog input signal into a digital output signal and comprises a threshold as well as an upper and a lower hysteresis threshold. Given transgression of the upper or lower hysteresis threshold by the analog input signal, at least one unlatch signal may be formed that enables the switching of the digital output signal when the analog input signal upwardly transgresses the threshold.

Independently of the at least one unlatch signal, the digital output signal may then be switched when the analog input signal transgresses the upper or lower hysteresis threshold. In other words, the digital output signal may be unconditionally switched when the analog input signal transgresses one of the hysteresis thresholds. This avoids a "false" switching behavior when the analog input signal in fact transgresses the threshold but does not reach the corresponding hysteresis thresholds. Given the known art that was initially explained, in contrast, the simple unlatching by using a comparator with hysteresis only enables a switching given upward transgression of a hysteresis threshold, as a result of which the digital output signal is only an inexact map of the analog input signal. In particular, switching is carried out in the invention given great differences between the analog input signal and the threshold.

DESCRIPTION OF THE DRAWINGS

The invention is presented in greater detail below on the basis of the drawings.

DETAILED DESCRIPTION OF THE PREFERRED EMBODIMENTS

Figure 1A:
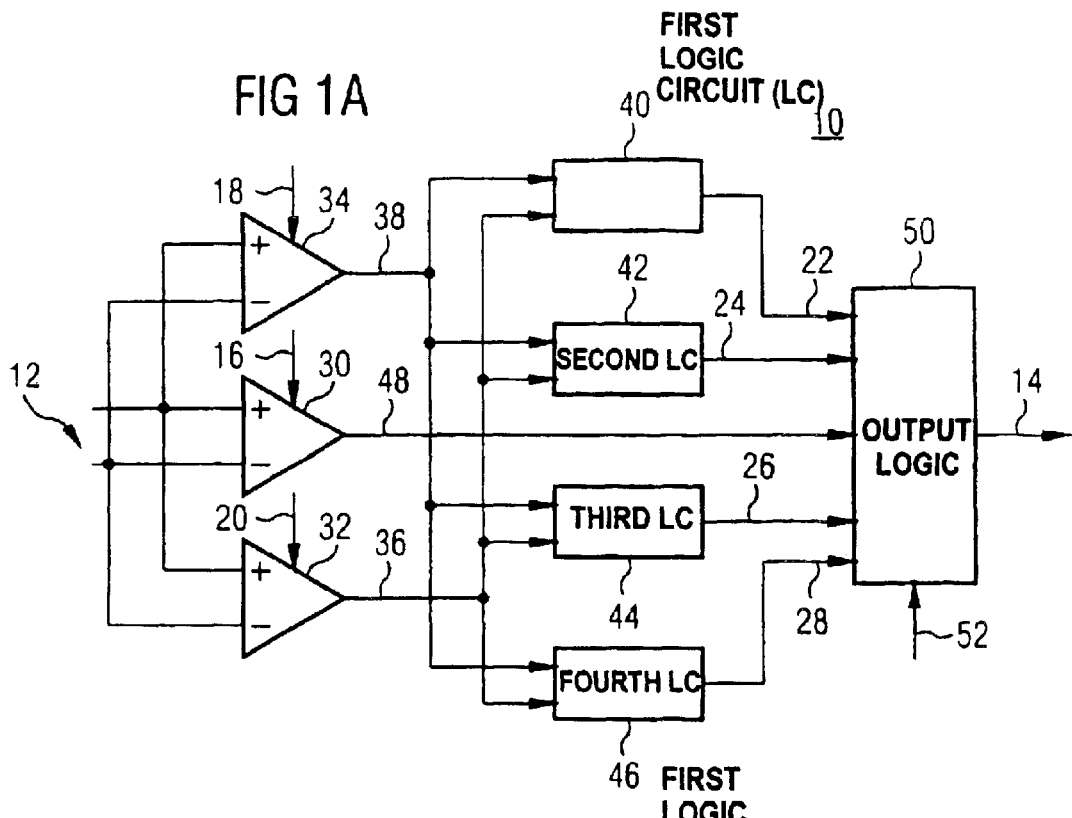
FIG. 1A is a block circuit diagram of a first exemplary embodiment of the inventive comparator circuit.

Various preferred embodiments of the invention are envisioned. In a preferred embodiment of the comparator circuit, a subsequent switching of the digital output signal following a switching of the digital output signal can—independently of at least one unlatch signal—only ensue again by way of transgression of the upper or of the lower hysteresis threshold by the analog input signal.

The comparator circuit preferably comprises a first comparator for the threshold, a second comparator for the lower hysteresis threshold and a third comparator for the upper hysteresis threshold. A separate comparator is thus provided for each threshold. As a result, the thresholds can be set independently of one another and with high precision.

In a preferred embodiment, the comparator output signals of the second and third comparator are processed by at least one logic circuit such that the at least one unlatch signal that enables a switching of the digital output signal is generated from it.

In an alternative embodiment that is less involved in circuit-oriented terms, the comparator circuit can comprise a first comparator for the threshold and a second comparator for the lower and upper hysteresis threshold. The third comparator can be eliminated in this embodiment.

The second comparator is preferably switched with a clock frequency, and the at least one unlatch signal is generated with a logic circuit. The clock frequency can be selected such that unwanted signals in the analog input signal are filtered out by the switching of the second comparator. Typically, the at least one unlatch signal can be generated in at least two successive clock cycles of the clock frequency.

In a preferred embodiment, finally, a further switching following a switching of the digital output signal cannot ensue until the expiration of a prescribable time duration of, for example, 10 µs. This embodiment proves advantageous given unwanted signals having a shorter time duration than the prescribable time duration. Basically, these then no longer influence the digital output signal. Preferably, the prescribable time duration is selected such that it is longer than the time duration of unwanted signals contained in the analog input signal.

The hysteresis thresholds can be formed by voltages that are present at the inputs of the comparator circuit. Given such an embodiment, the hysteresis thresholds are not formed in the comparator itself. This permits setting the hysteresis thresholds in that the voltages that form the hysteresis thresholds and are present at the inputs of the comparator circuit are varied. Variations of the hysteresis thresholds are therefore possible without circuit-oriented modifications.

In particular, the voltages that form the hysteresis thresholds can be generated by current sources that impress currents into a voltage divider. The voltages that are present at the comparator inputs for setting the hysteresis thresholds can then be set via the voltage divider. Current sources can, for example, be realized by current mirrors. The voltages forming hysteresis thresholds can be exactly set since the output current of the current sources can be precisely adjusted. Current sources and a voltage divider are suited for an implementation in an integrated circuit.

In a preferred embodiment in which the hysteresis thresholds are formed by voltages, the comparator circuit may comprise comparators that are zero-difference voltage detectors.

The inventive comparator may preferably be utilized in a sensor circuit, for example, in a Hall sensor circuit.

These embodiments are described in more detail below.

The comparator circuit 10 shown in FIG. 1A maps an analog, differential input signal 12 into a digital output signal 14. To this end, the comparator circuit 10 comprises a first comparator 30 that compares the analog input signal 12 to a threshold 16 and generates the comparator output signal 48 dependent on the result of the comparison. Further, a second comparator 32 for comparing the analog input signal 12 to a lower hysteresis threshold 20 and a third comparator 34 for comparing the analog input signal 12 to an upper hysteresis threshold 18 are provided. The second comparator 32 and the third comparator 34 each respectively supplies a comparator output signal 36 or 38 that are supplied to a first, second, third and fourth logic circuit 40, 42, 44 or 46.

The first logic circuit 40 generates a first unlatch signal 22, the second logic circuit 42 generates a second unlatch signal 24, the third logic circuit 44 generates a third unlatch signal 26, and the fourth logic circuit 46 generates a fourth unlatch signal 28. The unlatch signals 22, 24, 26 and 28 are supplied to an output logic 50 that generates the digital output signal 14 utilizing these unlatch signals 22, 24, 26 and 28 and with the comparator output signal 48 of the first comparator 30.

The function of the above-described comparator circuit 10 is explained below. In particular, the functioning of the logic circuits 40, 42, 44 and 46 as well as of the output logic 50 is described. The three comparators 30, 32 and 32 respectively acquire the analog input signal 12 with different switching thresholds. The first comparator 30 acquires the analog input signal 12 with a middle switching threshold Ref that is the threshold 16. The hysteresis comparators 32 and 34 acquire the analog input signal 12 offset from the middle switching threshold Ref by half the amount of a hysteresis Hys, the resulting lower and upper hysteresis threshold 20 or 18 being −Hys/2+Ref or+Hys/2+Ref.

Given great signal boosts of the analog input signal 12 that would transgress the upper or lower hysteresis threshold 18 or 20, the second 42 or third 44 logic circuit sets enable signals that result in the output logic 50 enabling the through-connection of the comparator output signal 48 of the first comparator 30 into the respective direction (toward logical high if the lower hysteresis threshold 20 or −Hys/2+Ref was overcome and vice versa). In this case, the first comparator 30 directly switches the digital output signal 14 in the zero-axis crossing at Ref, i.e., at the threshold 16.

In order to avoid a pendular switching given an analog input signal 12 with superimposed noise or unwanted signals, a switching of the digital output signal 14 in the output logic 50 is not enabled until after transgression of the upper or lower hysteresis threshold 18 or 20. This ensues in that the second or third comparator 32 or 34 sets a signal via the second or third logic circuit 42 or 44 that is transmitted to the output logic 50 as second or third unlatch signal 24 or 26. The second unlatch signal 24 is set to logical high by the second logic circuit 42 given a positive or rising edge of the comparator output signal 36. It is set to logical low when the comparator output signal 38 is logical high. The third unlatch signal 26 is set to logical low by the third logic circuit 44 given a negative or falling edge of the comparator output signal 38. It is set to logical high when the comparator output signal 36 is logical low.

In case of too small an analog input signal 12 or in case of an unwanted signal that only transgress the threshold 16 but not the hysteresis threshold 18 or 20 lying in the respective signal direction, the first comparator 30—given an analog input signal 12 that again falls or rises—can subsequently usually not reset the second and third logic circuit 42 or 44 since the signals required to do this are not present.

When the analog input signal 12 also drops below the lower hysteresis threshold 20 (=−Hys/2+Ref), the fourth unlatch signal 28 is set to logical low via the fourth logic circuit, resulting in the output logic 50 switching the digital output signal 14 to logical low. When the analog input signal 12 exceeds the upper hysteresis threshold 20 (=+Hys/2+Ref) without having downwardly transgressed the lower hysteresis threshold 20 immediately before, the first unlatch signal 22 is set to logical high via the first logic circuit 40, resulting in the output logic 50 switching the digital output signal 14 to logical high. The digital output signal 14 is thus always correctly switched. Although the resultant signal 14 is somewhat phase-offset relative to the analog input signal 12, the successor conditions are correct.

The logical functions that are realized by the logic circuits 40, 42, 44 and 46 and the output logic 50 are summarized below:

The first logic circuit 40 sets the first unlatch signal 22 to logical high when the second and third comparator output signal 36 and 38 are logical high, i.e., the analog input signal 12 has transgressed the upper hysteresis threshold 18.

The second logic circuit 42 sets the second unlatch signal 24 to logical high given a positive or rising edge of the of the second comparator output signal 36, i.e., when the lower hysteresis threshold 20 has been transgressed. It resets the second unlatch signal 24 to logical low when the upper hysteresis threshold 18 has been transgressed, when the third comparator output signal 38 is logical high.

The third logic circuit 44 sets the third unlatch signal 26 to logical low given a negative or falling edge of the third comparator output signal 38, i.e., when the upper hysteresis threshold has been downwardly transgressed. It resets the third unlatch signal 26 to logical high when the lower hysteresis threshold 20 has been upwardly transgressed, when the second comparator output signal 36 is logical low.

The fourth logic circuit 44 sets the fourth unlatch signal 28 to logical low when the second and third comparator output signal 36 and 38 are logical low, i.e., the analog input signal 12 has downwardly transgressed the lower hysteresis threshold 20.

In an embodiment that is not shown here, the following, positive edge of the analog input signal 12 can only be switched again via the third comparator 34 with a signal greater than the upper hysteresis threshold 18 at the output. As a result, this enables a symmetrical switch behavior relative to the threshold 16. The first comparator 30 can only switch again, i.e., its comparator output signal 48 acts directly on the digital output signal 14, only when both hysteresis thresholds 18 and 20 have been transgressed in terms of amount. In order to previously inhibit the first comparator 30, for example, an additional RS flip-flop can be set when an arbitrary valued signal is through-connected to the output of the comparator circuit 10. This RS flip-flop is not reset until the opposite valued signal is reached.

Figure 1B:
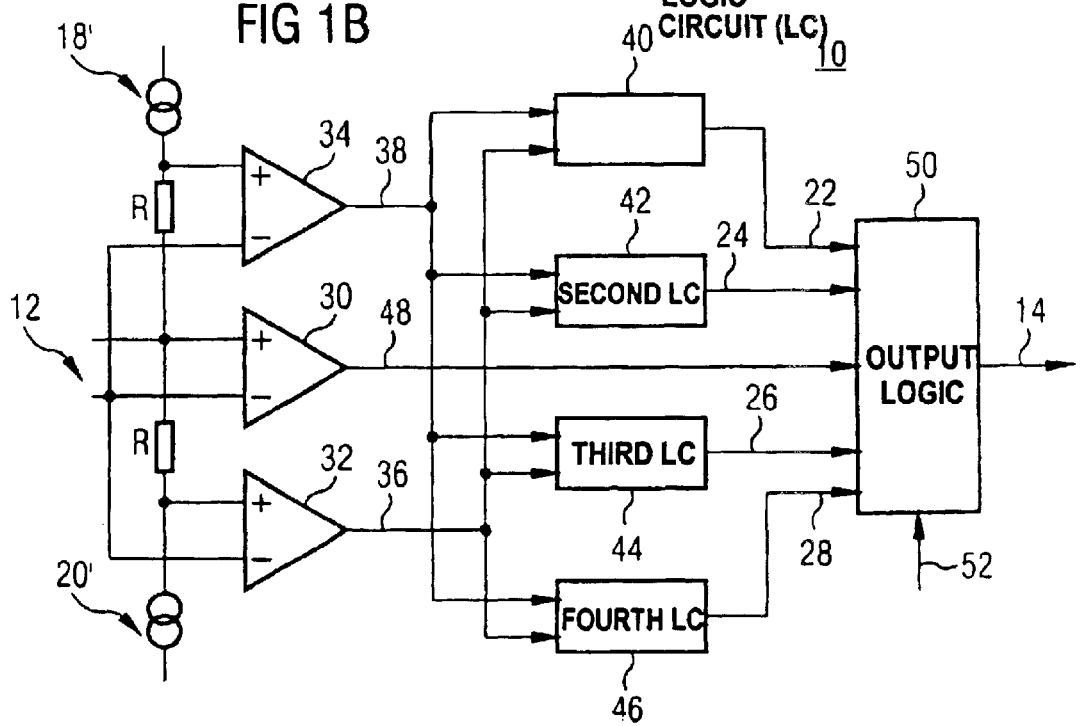
FIG. 1B is a block circuit diagram of a second exemplary embodiment of the inventive comparator circuit.

FIG. 1B shows a comparator circuit 10 that generally corresponds to the comparator circuit shown in FIG. 1A, but differs in the way the hysteresis thresholds are set. Given the comparator circuit 10 shown in FIG. 1B, these are set by voltages that are present at the positive, non-inverting inputs of the comparators 30, 32 and 34. The voltages are formed via a voltage divider that comprises two identical resistors R. The two series-connected resistors R are supplied with a given current by two current sources 18' and 20'. As a result of the currents impressed by the current sources 18' and 20', voltages drop off at the resistors R that are present at the non-inverting inputs of the comparators 30, 32 and 34 and that set the upper and the lower hysteresis threshold 18 or 20 as well as the threshold 16. These voltages can be varied by setting the currents impressed by the current sources 18' and 20'. The hysteresis thresholds 18 and 20 as well as the threshold 16 can thus be set without circuit-oriented modifications. In this embodiment, the comparators 30, 32 and 34 are zero-difference voltage detectors that detect the difference voltages present at their inverting and non-inverting inputs.

Figure 2:
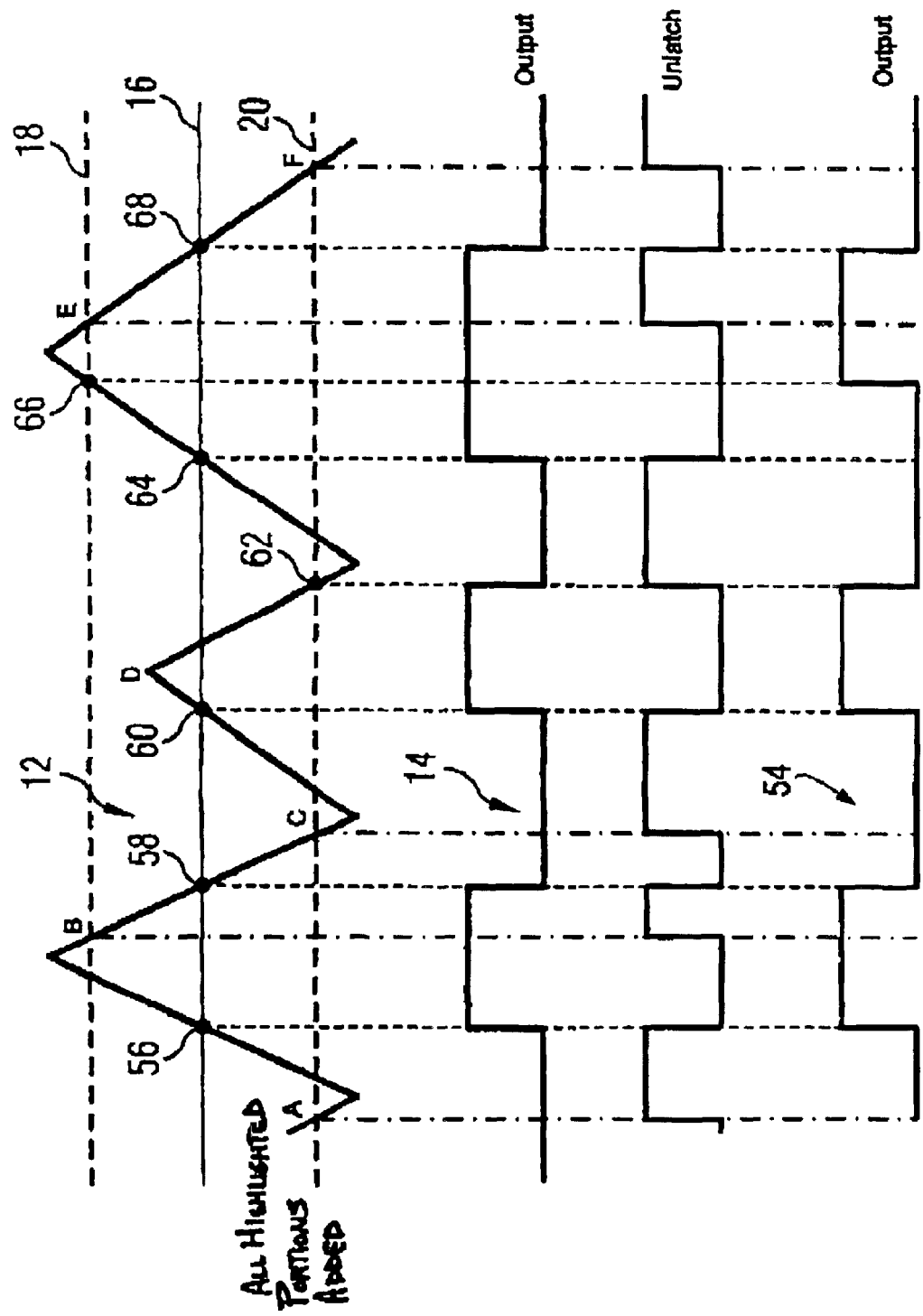
FIG. 2 is a graph with the curve of an analog input signal, of a digital output signal of the comparator circuit shown in FIG. 1A and of a digital output signal of an improved embodiment of the comparator circuit shown in FIG. 1A.

FIG. 2 shows an exemplary signal curve of an analog input signal 12 and of digital output signals 14 and 54 generated therefrom with the inventive comparator circuit 10. The unlatch signal has been set by the analog input signal 12 exceeding the lower hysteresis threshold 20 at point A. At a first switching point 56, the analog input signal 12 exceeds the threshold 16, resulting in the digital output signals 14 and 54 being switched from low to high, and resetting the unlatch signal. After the analog input signal 12 exceeds the upper hysteresis threshold 18, the unlatch is set by the crossing of the upper hysteresis threshold 18 at point B; the analog input signal 12 decreases and falls below the threshold 16 at the second switching point 58, and the unlatch signal is reset. As a result, the digital output signals 14 and 54 are switched back from logical high to logical low.

The analog input signal 12 then drops below the lower hysteresis threshold 20 at point C, setting the unlatch signal, and exceeds this in order to then again exceed the threshold 16 at the third switching point 60, resetting the unlatch signal. As a result, the digital output signals 14 and 54 are switched again from logical low to logical high. The analog input signal 12 now drops at point D before exceeding the upper hysteresis threshold 18, downwardly transgresses the threshold 16 and the lower hysteresis threshold 20 thereafter at the fourth switching point 62, setting the unlatch signal. As a result, the digital output signals are again switched back from logical high to logical low.

The analog input signal 12 now rises again until it exceeds the threshold 16 at the fifth switching point 64. This results in the digital output signal 14 being switched from logical low to logical high, and the unlatch signal is reset. The digital output signal 54 remains at logical low since it is generated by an embodiment (not shown) of the comparator circuit 10 that switches symmetrically around the threshold 16. At the sixth switching point 66, the analog input signal 12 again exceeds the upper hysteresis threshold 18, as a result of which the digital output signal 54 is now switched from logical low to logical high. Subsequently, the analog input signal 12 drops below the upper hysteresis threshold 18 at point E, setting the unlatch, and drops below the threshold 16 at the seventh switching point 68, resetting the unlatch signal. This results in that both digital output signals 14 and 54 are again switched back from logical high to logical low.

It can be seen on the basis of this signal curve of the analog input signal 12 and of the digital output signals 14 and 54, particularly at the fourth, fifth and sixth switching point 62, 64 or 66, that the digital output signals 14 and 54 exhibit the correct statuses, in contrast to the traditional known comparator circuits known. The curve of the analog input signal 12 at these switching points, namely, would not cause a switching of the digital output signal from logical high to logical low given the traditional comparator circuits. The digital output signal can contain a false status as a result of traditional circuits.

Figure 3:
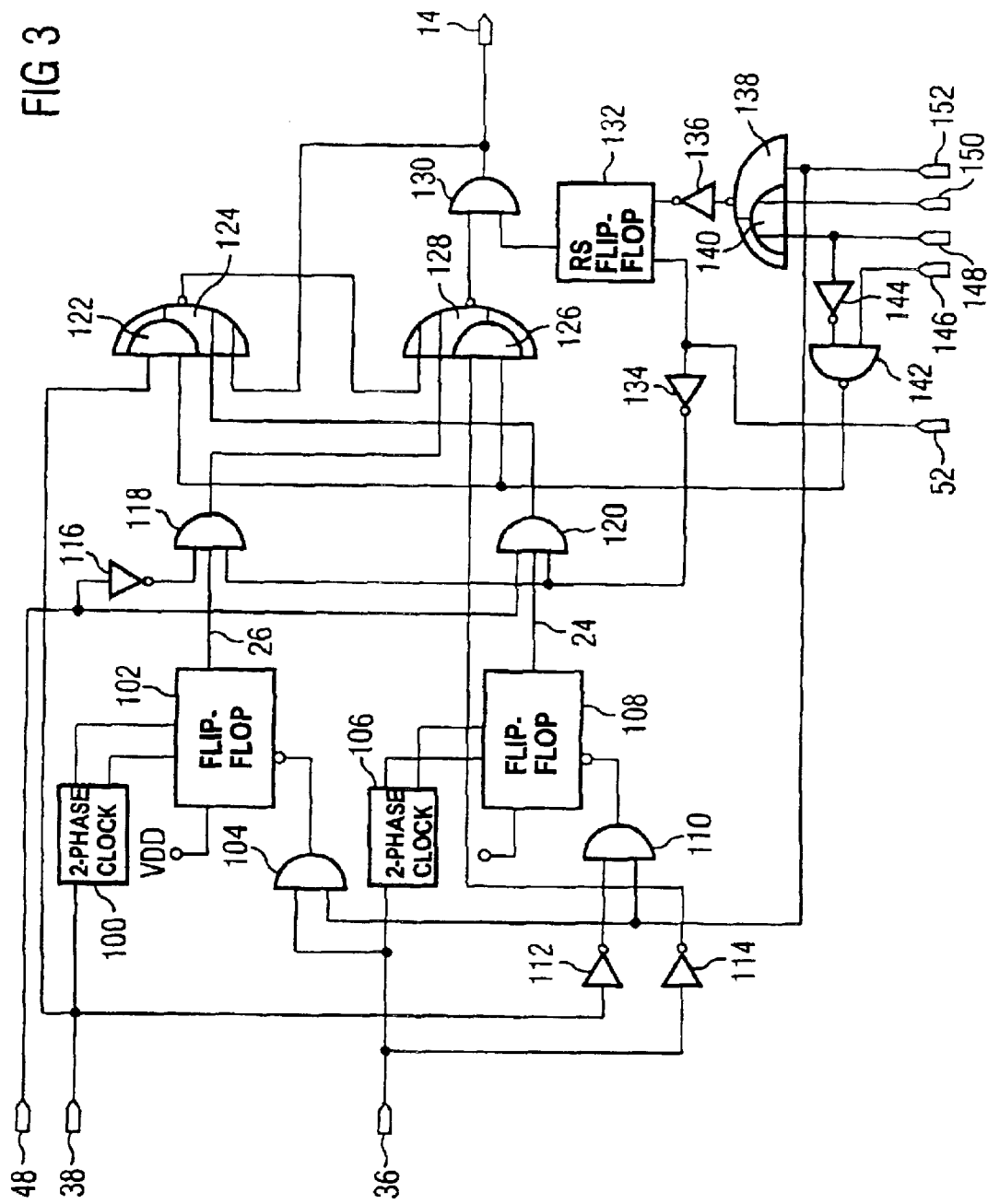
FIG. 3 is a schematic diagram of an exemplary embodiment of the logic circuit of the comparator circuit shown in FIG. 1A.

FIG. 3 shows a specific implementation of the logic circuits of the comparator circuit 10 of FIG. 1A that are formed by the logic blocks 40, 42, 44, 46 and 50.

The logic circuit shown in FIG. 3 receives—among other things—the comparator output signals 36, 38 and 48 as input signals. The comparator output signals 36 and 38 are respectively supplied to a 2-phase clock generator 100 or 106 that generates a non-overlapping master-slave clock with which a flip-flop 102 or 108 is respectively clocked.

The inputs of the flip-flops 102 and 108 are wired with a logical high, for example, the operating voltage VDD of the comparator circuit 10. The flip-flop 102 generates the third unlatch signal 26 given a dropping edge of the comparator output signal 38 of the third comparator 34, i.e., when the upper hysteresis threshold 18 is downwardly transgressed. The flip-flop 108 generates the second unlatch signal 24 given a dropping edge of the comparator output signal 36 of the second comparator 32, i.e., when the lower hysteresis threshold 20 is downwardly transgressed.

The flip-flop 102 is reset when the comparator output signal 36 becomes a logical low. To this end, the reset input of the flip-flop 102 is fashioned as inverting input. Correspondingly, the flip-flop 108 is reset when the comparator output signal 38 becomes logical high. The reset input of the flip-flop 108 is also fashioned as inverting input. Specifically, the reset signal for the flip-flop 102 is formed via an AND gate 104, being formed from the comparator output signal 16 and an rq signal 152 that is a central reset signal of the comparator circuit 10. The rest signal for the flip-flop 108 is likewise formed via an AND gate 110 from the rq signal 152 and the comparator output signal 38 inverted with an inverter 112.

The comparator output signal 48 of the first comparator 30 for the threshold 16 is respectively logically operated via an AND gate 118 or 120 with the third or second unlatch signal 26 or 24. Before the operation with the AND gate 118, the comparator output signal 48 is inverted with an inverter 116. Likewise, the inhibit signal 52 is inverted with an inverter 134 before the operation with the unlatch signals 24 and 26 as well as the comparator output signal 48.

The output signal of the AND gate 118 is supplied to a NOR gate 128 that logically operates the supplied signal with the output signal of a NOR gate 124 and the output signal of an AND gate 126. The AND gate 126 in turn operates the comparator output signal 36 inverted with an inverter 114 with an output signal of a NAND gate 142. The NAND gate 142 in turn operates an uncal signal 146 with a fused signal 148 inverted with an inverter 144.

The output signal of the AND gate 120 is supplied to the NOR gate that operates it with the digital output signal 14 of the comparator circuit 10 and the output signal of an AND gate 122. The AND gate 122 in turn operates the comparator output signal 38 with the output signal of the previously mentioned NAND gate 142.

Finally, the output signal of the NOR gate 128 is supplied to an AND gate 130 that logically operates it with the output signal of an RS flip-flop 132. The RS flip-flop 132 is supplied with the inhibit signal 52 as well as with the output signal of an NAND gate inverted with an inverter 136 as input signal. The NAND gate 138 in turn operates the central reset signal 152 with the output signal of an OR gat 140 that in turn operates the fused signal 148 and an rq_u_wdrq signal 150.

The allocation of individual elements of FIG. 3 to the logic blocks in FIG. 1A is explained again briefly below: The output logic 50 is primarily formed by the elements 118, 120, 122, 124, 126 arid 128 in FIG. 3. The second logic circuit is primarily formed by the elements 106, 108, 110 and 112 in FIG. 3. The third logic circuit 44 is primarily formed by the elements 100, 102 and 104 in FIG. 3. Finally, the elements 130, 132, 136, 138, 140, 142 and 144 in FIG. 3 form a reset and inhibit logic that serves for controlling the logic circuit shown in FIG. 3.

For the purposes of promoting an understanding of the principles of the invention, reference has been made to the preferred embodiments illustrated in the drawings, and specific language has been used to describe these embodiments. However, no limitation of the scope of the invention is intended by this specific language, and the invention should be construed to encompass all embodiments that would normally occur to one of ordinary skill in the art.

The present invention may be described in terms of functional block components and various processing steps. Such functional blocks may be realized by any number of hardware and/or software components configured to perform the specified functions. For example, the present invention may employ various integrated circuit components, etc. Furthermore, the present invention could employ any number of conventional techniques for electronics configuration, signal processing and/or control and the like.

The particular implementations shown and described herein are illustrative examples of the invention and are not intended to otherwise limit the scope of the invention in any way. For the sake of brevity, conventional electronics and other functional aspects of the systems (and components of the individual operating components of the systems) may not be described in detail. Furthermore, the connecting lines, or connectors shown in the various figures presented are intended to represent exemplary functional relationships and/or physical or logical couplings between the various elements. It should be noted that many alternative or additional functional relationships, physical connections or logical connections may be present in a practical device. Moreover, no item or component is essential to the practice of the invention unless the element is specifically described as "essential" or "critical". Numerous modifications and adaptations will be readily apparent to those skilled in this art without departing from the spirit and scope of the present invention.

LIST OF REFERENCE CHARACTERS 10 comparator circuit
12 analog input signal
14 digital output signal
16 threshold
18 upper hysteresis threshold
20 lower hysteresis threshold
18' current source
20' current source
22 first unlatch signal
24 second unlatch signal
26 third unlatch signal 28 fourth unlatch signal
30 first comparator
32 second comparator
34 third comparator
36 comparator output signal
38 comparator output signal
40 first logic circuit
42 second logic circuit
44 third logic circuit
46 fourth logic circuit
48 comparator output signal
50 output logic
52 inhibit signal
54 digital output signal
56 first switching point
58 second switching point
60 third switching point
62 fourth switching point
64 fifth switching point
66 sixth switching point
68 seventh switching point
100 2-phase clock generator
102 flip-flop
104 AND gate
106 2-phase clock generator
108 flip-flop
110 AND gate
112 inverter
114 inverter
116 inverter
118 AND gate
120 AND gate
122 AND gate
124 NOR gate
126 AND gate
128 NAND gate
130 AND gate
132 RS flip-flop
134 inverter
136 inverter
138 NOR gate
140 OR gate
142 NAND gate
144 inverter
146 uncal signal
148 fused signal
150 rq_u_wdrc signal
152 rq signal
R resistor

What is claimed is:

1. A comparator circuit that maps an analog input signal into a digital output signal, comprising:
   a threshold value;
   an upper hysteresis threshold value;
   a lower hysteresis threshold value;
   an analog signal input;
   output logic comprising at least one unlatch signal input and a digital signal output; and
   processing logic configured to hold the threshold value, the upper hysteresis threshold value, the lower hysteresis threshold value and connected to the analog signal input, the processing logic being further configured to provide the at least one unlatch signal input to the output logic such that given a transgression of the upper or lower hysteresis threshold value by the analog input signal, the at least one unlatch signal is formed that enables the switching of the digital output signal when the analog input signal upwardly or downwardly transgresses the threshold value, wherein, independently of the at least one unlatch signal, the digital output signal is switched when the analog input signal transgresses the upper or lower hysteresis threshold value from between the upper and lower hysteresis threshold value, if it was not switched at the threshold value.

2. The comparator circuit according to claim 1, wherein, after the a switching of the digital output signal independently of the at least one unlatch signal at the lower or upper threshold value, a subsequent switching of the digital output signal can only ensue again when the analog input signal transgresses, respectively, the upper or the lower hysteresis threshold value.

3. The comparator circuit according to claim 1, further comprising:
   a first comparator that comprises the threshold value;
   a second comparator that comprises the lower hysteresis threshold value; and
   a third comparator that comprises the upper hysteresis threshold value.

4. The comparator circuit according to claim 3, further comprising:
   a logic circuit comprising an input connected to an output of the second comparator and an input connected to an output of the third comparator, the logic circuit further comprising an output connected to the at least one unlatch signal input of the output logic, the logic circuit being configured to generate the at least one unlatch signal based on the output of the second comparator and the output of the third comparator.

5. The comparator circuit according to claim 1, further comprising:
   a first comparator that comprises the threshold value; and
   a second comparator that comprises the lower hysteresis threshold value and the upper hysteresis threshold value.

6. The comparator circuit according to claim 5, wherein the second comparator further comprises:
   a clock input configured to accept a signal at a clock frequency; and
   at least one second comparator logic circuit configured to generate the at least one unlatch signal.

7. The comparator circuit according to claim 6, wherein the at least one unlatch signal is generated in at least two successive clock cycles of the clock frequency.

8. The comparator circuit according to claim 1, wherein the comparator circuit is configured such that, after a switching of the digital output signal, a further switching can only ensue after an expiration of a prescribable time duration.

9. The comparator circuit according to claim 8, wherein the prescribable time duration is selected such that it is longer than a time duration of unwanted signals contained in the analog input signal.

10. The comparator circuit according to claim 1, further comprising:

an upper limit voltage source connected to the circuitry defining the upper hysteresis threshold value and having a voltage that defines an upper voltage threshold value for the comparator circuit; and an lower limit voltage source connected to the circuitry defining the lower hysteresis threshold value and having a voltage that defines a lower voltage threshold value for the comparator circuit.

11. The comparator circuit according to claim 10, further comprising:

a voltage divider circuit; and at least one current source that provides current through the voltage divider circuit, the voltage divider circuit thereby providing the upper limit voltage source as well as the lower limit voltage source.

12. The comparator circuit according to claim 10, further comprising comparators that are zero-difference voltage detectors.

13. A sensor circuit comprising a comparator circuit according to claim 1.

* * * * *